United States Patent [19]
Minami

[11] Patent Number: 5,492,852
[45] Date of Patent: Feb. 20, 1996

[54] METHOD FOR FABRICATING A SOLID IMAGING DEVICE HAVING IMPROVED SMEAR AND BREAKDOWN VOLTAGE CHARACTERISTICS

[75] Inventor: Kazuma Minami, Tokyo, Japan

[73] Assignee: NEC Corporation, Tokyo, Japan

[21] Appl. No.: 319,101

[22] Filed: Oct. 6, 1994

[30] Foreign Application Priority Data

Oct. 7, 1993 [JP] Japan .................. 5-251255
  Oct. 21, 1993 [JP] Japan .................. 5-285757

[51] Int. Cl.⁶ .......... H01L 21/70; H01L 27/00; H01L 21/44; H01L 21/48
[52] U.S. Cl. .......... 437/53; 437/50; 437/195; 437/920; 437/983
[58] Field of Search .......... 437/920, 50, 53, 437/983, 195; 257/232, 239, 250

[56] References Cited

U.S. PATENT DOCUMENTS

| | | | |
|---|---|---|---|
| 4,290,187 | 9/1981 | Stein | 437/53 |
| 4,672,455 | 6/1987 | Miyatake | 257/250 |
| 5,286,988 | 2/1994 | Nishi | 257/250 |
| 5,288,656 | 2/1994 | Kusaka et al. | 437/50 |
| 5,302,545 | 4/1994 | Okada et al. | 437/979 |
| 5,306,906 | 4/1994 | Aoki et al. | 257/232 |
| 5,313,081 | 5/1994 | Yamada | 257/232 |
| 5,357,129 | 10/1994 | Kamimura | 257/239 |
| 5,359,213 | 10/1994 | Lee et al. | 257/250 |

FOREIGN PATENT DOCUMENTS 4-279061A 10/1992 Japan .................. 437/53

OTHER PUBLICATIONS

By K. Gundo et al., "½" 600 k–Pixel Interline Transfer CCD Image Sensor with Single Poly–Silicon Electrode Structure", Extended Abstracts of the 22nd (1990 International) Conference on Solid SAtate Devices and Materials, 1990, pp. 709–712.

Primary Examiner—Olik Chaudhuri
Assistant Examiner—Brian K. Dutton
Attorney, Agent, or Firm—Young & Thompson

[57] ABSTRACT

The invention provides a method for fabricating a solid imaging device in which an insulation film including at least a silicon oxide film deposited by a chemical vapor deposition method is formed on a surface of the device. An exposed part of the insulation film may be etched prior to forming a shield film, thereby preventing an incident light to enter into all surface of the device except for a photoelectric conversion region.

6 Claims, 11 Drawing Sheets

METHOD FOR FABRICATING A SOLID IMAGING DEVICE HAVING IMPROVED SMEAR AND BREAKDOWN VOLTAGE CHARACTERISTICS

BACKGROUND OF THE INVENTION

This invention relates to a solid imaging device with a charge-coupled device (CCD) used for a charge transfer region transferring signal charges generated by a photoelectric conversion, and more particularly to a method for fabricating a solid imaging device having a structure for improving a smear and a breakdown voltage characteristics.

In a solid imaging device, an incident light energy is converted into an electric signal to generate a signal charge to be transferred to an output region through the charge transfer region for subsequent conversion into a voltage signal to be output of this device. The solid imaging device has a problem in phenomenon so called smear. The phenomenon due to the smear is like that the incident light energy which entered in and around the charge transfer region is converted into the electric signal, by which a generated charge mixes with the signal charge to obtain an alias.

A conventional method for fabricating the solid imaging device is described with referenced to the accompanying drawings.

Figure 1A:
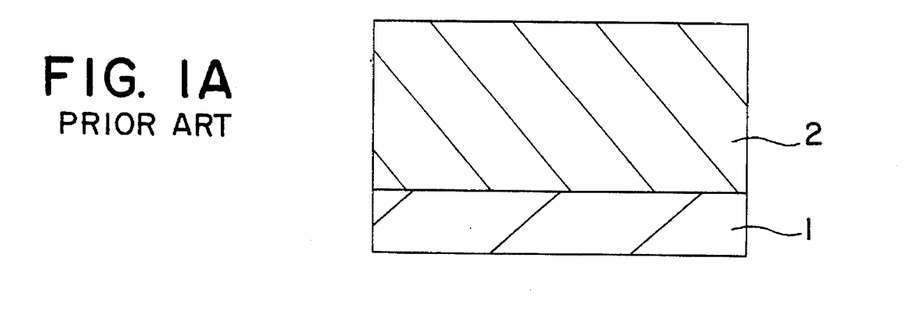
FIGS. 1A through 1F are cross sectional views showing sequential steps of the conventional method for fabricating a solid imaging device.

Referring to FIG. 1A, an n-type silicon substrate 1 is prepared to form the solid imaging device. A boron (B) is implanted into the n-type silicon substrate 1 by use of an ion implantation method to form a first p-type well layer 2 by a heat treatment at high temperature.

Figure 1B:
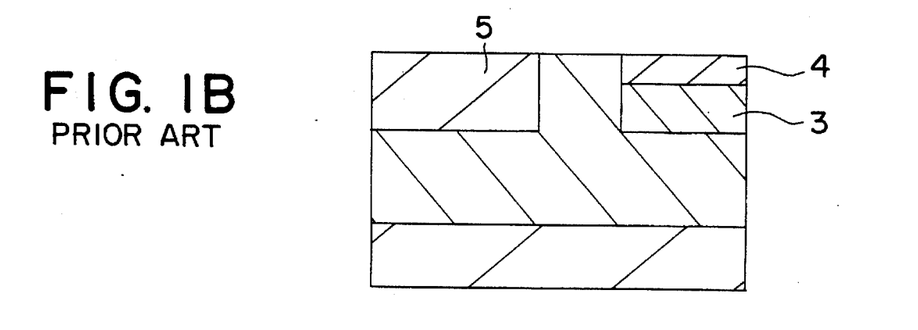

Referring to FIG. 1B, a photoresist is applied on the first p-type well layer 2 to implant ions of a p-type impurity and an n-type impurity into the first p-type well layer 2, thereby forming a second p-type well layer 3, an n-type semiconductor layer 4 to be used as the charge transfer region and an n-type semiconductor layer 5 to be used as the photoelectric conversion region, respectively. The p-type well layer 3 is provided for prevention of a punch-through between the n-type semiconductor layer 4 and n-type semiconductor layer 5 and for control of a channel potential in the n-type semiconductor layer 4.

Figure 1C:
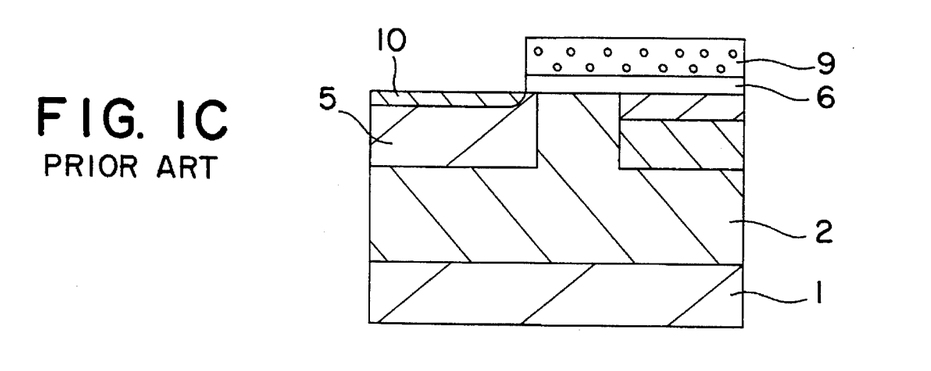

Referring to FIG. 1C, a silicon oxide film 6 is formed by use of a thermal oxidation method to be used as a gate silicon oxide film. After that, a polycrystalline silicon film is deposited on the silicon oxide film 6 to be subjected to a patterning to define a first charge transfer electrode 9. Subsequently, the photoresist and the first charge transfer electrode 9 are used as a mask, thereby implanting boron (B) into the n-type semiconductor layer 5 to form a shallow p-type semiconductor layer 10 for separating the n-type semiconductor layer 5 from the silicon oxide film 6 to reduce a dark current in the surface of the n-type semiconductor layer 5. After that, the exposed silicon oxide film 6 is etched by use of the first charge transfer electrode 9 as a mask.

Figure 1D:
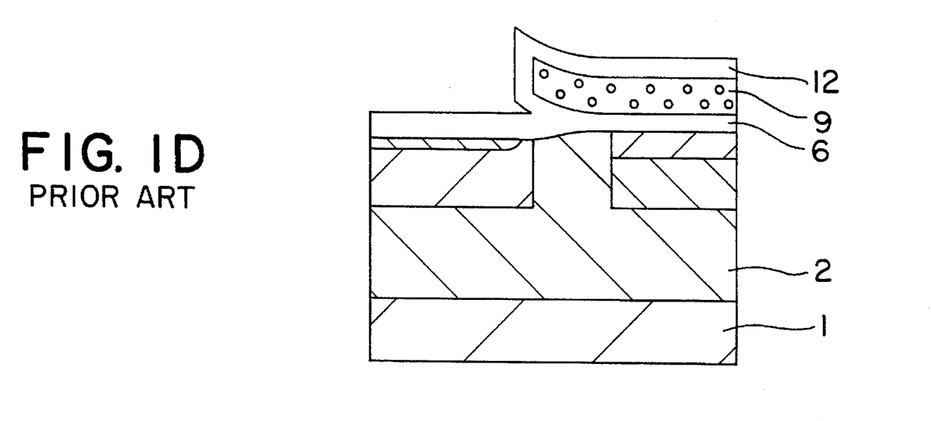

Referring to FIG. 1D, a gate silicon oxide film is formed on a surface of the device by use of the thermal oxidation method, after which a second charge transfer electrode (not shown) is formed by deposition of a surface of the polycrystalline silicon film and carrying out a patterning. Subsequently, a interlayer insulator 12 is formed on a surface of the charge transfer electrode 9 by use of the thermal oxidation method.

As the result of the above step that forms the gate oxide film and the interlayer insulator film 12 by use of the thermal oxidation method, the end of the first charge transfer electrode 9 is bent upward due to the formation of the oxide film under the first charge transfer electrode 9. If the state of the above first charge transfer electrode 9 is maintained, a coverage is changed to the worse in forming a shield film 16. Thus, there is a possibility to have the rest of etching occur when the shield layer is subjected to a patterning, and also a breakdown voltage between the charge transfer electrode and the shield film is decreased.

Figure 1E:
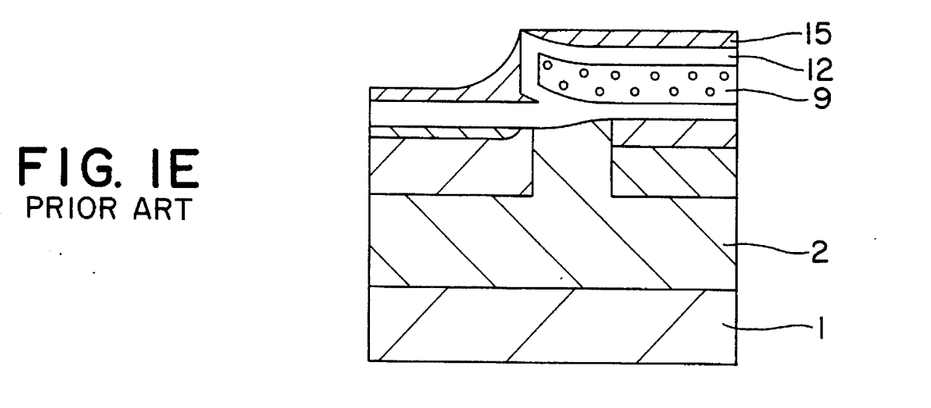
Figure 1F:
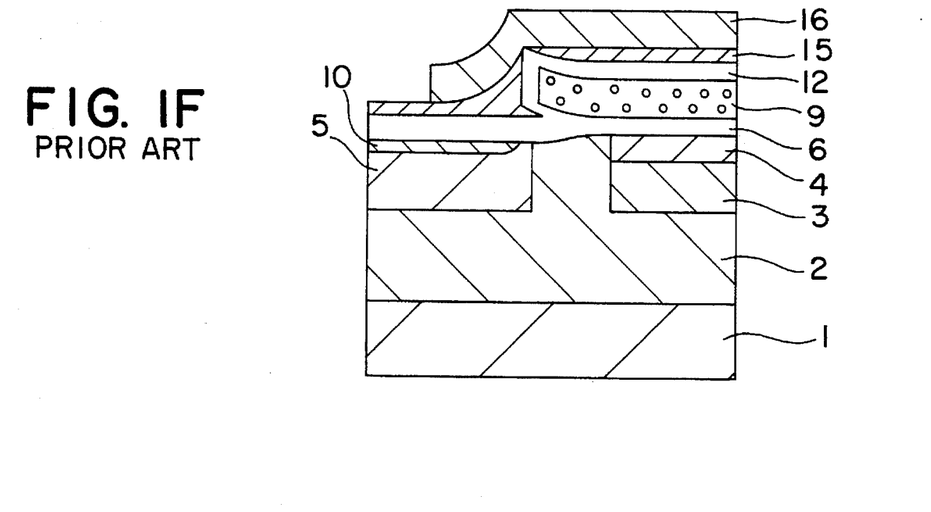

For solving the above issues, a second layer insulation film 15 is formed for filling up a difference in level of the first charge transfer electrode 9 to the silicon substrate as shown in FIG. 1E. Subsequently, the shield film 16 for preventing an incident light to enter into all surface of the device except for the photoelectric conversion region is formed as shown in FIG. 1F.

The conventional method for fabricating the solid imaging device is engaged with disadvantage as mentioned below. In the conventional method, for instance, the interlayer insulator 12 having a thickness of 300 to 400 nanometers is formed on the charge transfer electrode for maintenance of a high breakdown voltage and filling up the difference in level of the charge transfer electrode. Further, in the conventional method, the interlayer insulator 15 having the same thickness as that of the interlayer insulator 12 is also formed on the interlayer insulator 12. Accordingly, a total thicknesses of the interlayer insulator 15 and the gate silicon oxide film formed prior to forming of the second charge transfer electrode provides a long distance between the silicon substrate and the shield film 16. The long distance between the silicon substrate and the shield film 16 results in the increase of the incident light to enter into all surface of the device except for the photoelectric conversion region. Therefore, the smear level is also increased and an output of the solid imaging device includes errors.

Further, the conventional method for fabricating the solid imaging device is also engaged with disadvantage as mentioned below. A leakage current is increased in the silicon oxide film formed by thermal oxidation of the surface of the polycrystalline silicon film (the first charge transfer electrode 9) because of including large crystal grains of a silicon in the silicon oxide film as compared with a silicon oxide film formed by thermal oxidation of a normal silicon. Such silicon oxide film has a poor breakdown voltage. The polycrystalline silicon film having a thickness of approximately 400 nanometers may permit the silicon oxide film to have the required breakdown voltage. Although the thick polycrystalline silicon film may have the silicon oxide film free from the issue of the breakdown voltage, the smear level is increased as explained above.

SUMMARY OF THE INVENTION

Accordingly, it is an object of the invention to provide a novel method for fabricating a solid imaging device.

It is a further object of the invention to provide a method for fabricating a solid imaging device which can reduce a distance between a silicon substrate and a shield layer to be improved a smear characteristic.

It is still further object of the invention to provide a method for fabricating a solid imaging device which can be obtained a required breakdown voltage.

The above and other objects, features and advantages of the present invention will be apparent from the following descriptions.

In accordance with the invention, there is provided a method for fabricating a solid imaging device comprising the steps of selectively forming a photoelectric conversion region in a surface of a substrate on a predetermined area for permitting photons to be incident thereupon for subsequent conversion into signal charges, selectively forming a charge transfer region in the surface of the substrate on an area spaced apart from the predetermined area for transferring the signal charges, forming an insulation film including at least a silicon oxide film deposited by a chemical vapor deposition method on a surface of the device, selectively forming a first electrode through the insulation film over the charge transfer region and an upper region of the substrate between the photoelectric conversion region and the charge transfer region for controlling of transfer of the signal charges in the charge transfer region, forming a first interlayer insulator on the first electrode, selectively forming a second electrode through the insulation film over the charge transfer region and an upper region of the substrate between the photoelectric conversion region and the charge transfer region spaced apart from the first electrode through the first interlayer insulator for controlling of transfer of the signal charges in the charge transfer region, forming a second interlayer insulator on the second electrode and forming a shield film extending over the first and second electrodes and a part of the photoelectric conversion region for preventing an incident light to enter into all surface of the device except for the photoelectric conversion region.

In accordance with the invention, there is provided the method for fabricating the solid imaging device further comprising the step of etching, prior to the step of forming the shield film, an exposed part of the insulation film.

In accordance with the invention, there is further provided a method for fabricating a solid imaging device comprising the steps of selectively forming a p-type well layer in an upper region of a substrate, selectively forming a photoelectric conversion region in a surface of the p-type well layer on a predetermined area for permitting a photon to be incident thereupon for subsequent conversion into signal charges, selectively forming a charge transfer region in the surface of the p-type well layer on an area spaced apart from the predetermined area for transferring the signal charges, forming a first silicon oxide film by a thermal oxidation method on a surface of the device, forming a silicon nitride film by a chemical vapor deposition method on a surface of the device, forming a second silicon oxide film by the chemical vapor deposition method on a surface of the device, selectively forming a first electrode through the first silicon oxide film, the silicon nitride film and the second silicon oxide film over the charge transfer region and an upper region of the p-type well layer between the photoelectric conversion region and the charge transfer region for controlling of transfer of the signal charges in the charge transfer region, etching an exposed part of the second silicon oxide film, forming an third silicon oxide film by the chemical vapor deposition on a surface of the device, forming a first interlayer insulator by the thermal oxidation method on the first electrode, selectively forming a second electrode through the first silicon oxide film, the silicon nitride film and the third silicon oxide film over the charge transfer region and an upper region of the p-type well layer between the photoelectric conversion region and the charge transfer region spaced apart from the first electrode through the first interlayer insulator for controlling of transfer of the signal charges in the charge transfer region, etching an exposed part of the third silicon oxide film, forming an fourth silicon oxide film by use of the chemical vapor deposition method on a surface of the device, forming a second interlayer insulator on the second electrode and forming a shield film extending over the first and second electrodes and a part of the photoelectric conversion region for preventing an incident light to enter into all surface of the device except for the photoelectric conversion region.

In accordance with the invention, there is provided a method for fabricating a solid imaging device further comprising the step of etching, prior to the step of forming the shield film, an exposed part of the fourth silicon oxide film and the silicon nitride film.

In accordance with the invention, there is still further provided a method for fabricating a solid imaging device comprising the steps of selectively forming a photoelectric conversion region in a surface of a substrate on a predetermined area for permitting a photon to be incident thereupon for subsequent conversion into signal charges, selectively forming a charge transfer region in the surface of the substrate on an area spaced apart from the predetermined area for transferring the signal charges, forming a first gate silicon oxide film on a surface of the device, selectively forming a first electrode through the first gate silicon oxide film over the charge transfer region and an upper region of the p-type well layer between the photoelectric conversion region and the charge transfer region for controlling of transfer of the signal charges in the charge transfer region, etching an exposed part of the first gate silicon oxide film, forming a second gate silicon oxide film on a surface of the device, selectively forming a second electrode through the second gate silicon oxide film over the charge transfer region and an upper region of the p-type well layer between the photoelectric conversion region and the charge transfer region spaced apart from the first electrode through the second gate silicon oxide film for controlling of transfer of the signal charges in the charge transfer region, forming a interlayer insulator film on a surface of the device and forming a shield film extending over the first and second electrodes and a part of the photoelectric conversion region for preventing an incident light to enter into all surface of the device except for the photoelectric conversion region.

Each of the first and second gate silicon oxide film and the interlayer insulator is formed by a chemical vapor deposition method. Further, each of the first and second gate silicon oxide film has a thickness of 10 to 100 nanometers.

In accordance with the invention, there is provided a method for fabricating a solid imaging device comprising the steps of selectively forming a photoelectric conversion region in a surface of a substrate on a predetermined area for permitting photons to be incident thereupon for subsequent conversion into signal charges, selectively forming a charge transfer region in the surface of the substrate on an area spaced apart from the predetermined area for transferring the signal charges, forming a first gate silicon oxide film on a surface of the device, selectively forming a first electrode through the first gate silicon oxide film over the charge transfer region and an upper region of the p-type well layer between the photoelectric conversion region and the charge transfer region for controlling of transfer of the signal charges in the charge transfer region, etching an exposed part of the first gate silicon oxide film, forming a second gate silicon oxide film on a surface of the device, forming a third gate silicon oxide film on a surface of the device, selectively forming a second electrode through the second and third gate silicon oxide films over the charge transfer region and an upper region of the p-type well layer between the photoelectric conversion region and the charge transfer region spaced apart from the first electrode through the second and third gate silicon oxide films for controlling of transfer of the signal charges in the charge transfer region, forming a interlayer insulator film on a surface of the device and forming a shield film extending over the first and second electrodes and a part of the photoelectric conversion region for preventing an incident light to enter into all surface of the device except for the photoelectric conversion region.

The second gate silicon oxide film is formed by a thermal oxidation method and the third gate silicon oxide film is formed by a chemical vapor deposition method.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

A solid imaging device of a first embodiment according to the invention will be described with referenced to the accompanying drawings.

Figure 2A:
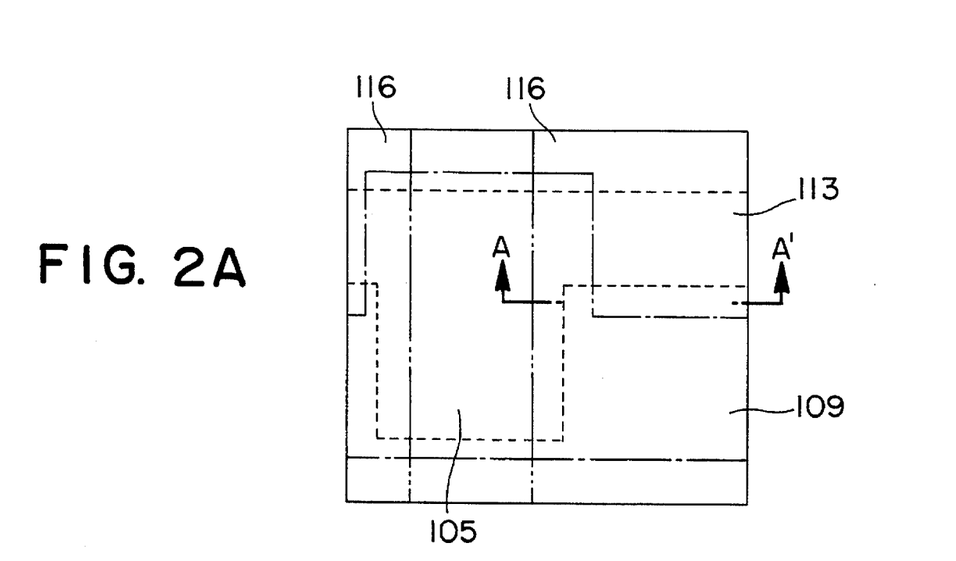
FIG. 2A is a plan view showing a solid imaging device of a first embodiment according to the invention.
Figure 2B:
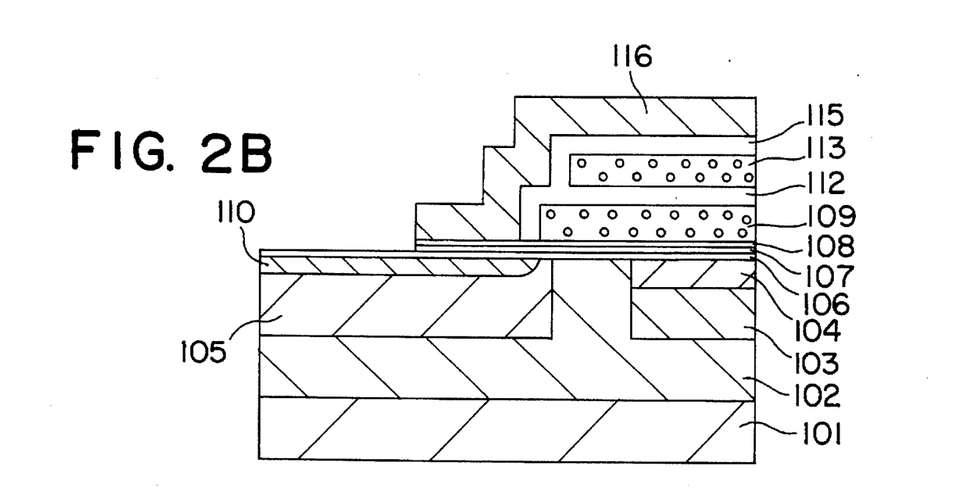
FIG. 2B is a cross sectional view taken generally on line A—A' in FIG. 2A showing a solid imaging device of a first embodiment according to the invention.

In FIGS. 2A and 2B, a pixel of a solid imaging device fabricated by use of a method of the invention comprises an n-type silicon substrate 101, a p-type well layer 102, a p-type well layer 103 used as a charge transfer region (a vertical CCD), an n-type well layer 104 for transferring a signal charge in the charge transfer region, an n-type semiconductor layer 105 used as a photoelectric conversion region, a silicon oxide film 106, a silicon nitride film 107, a first CVD silicon oxide film 108, a first charge transfer electrode 109 made of a polycrystalline silicon for controlling of transfer of the signal charges in the charge transfer region, a shallow p-type semiconductor layer 110 for separating the n-type semiconductor region 105 from the silicon oxide film 106 for reduction in a dark current, a first interlayer insulator 112, a second charge transfer electrode 113 made of the polycrystalline silicon for controlling of transfer of the signal charges in the charge transfer region, a third CVD silicon oxide film 114, a second interlayer insulator 115 and a shield film 116 made of tungsten for preventing an incident light to enter into all surface of the device except for the photoelectric region.

Figure 3A:
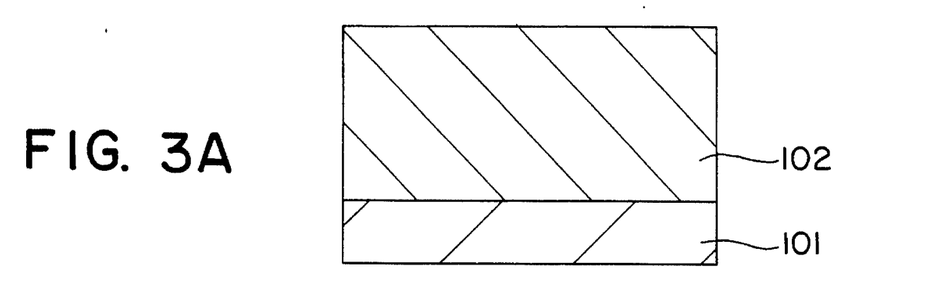
FIGS. 3A through 3J are cross sectional view showing sequential steps of a method for fabricating a solid imaging device.

The above solid imaging device is fabricated by the following manner. Referring to FIG. 3A, the n-type silicon substrate 101 is prepared to form the solid imaging device. Boron (B) is implanted into the surface of the n-type silicon substrate 101 by use of an ion implantation method to form the p-type well layer 102 by a heat treatment at approximately 1200° C.

Figure 3B:
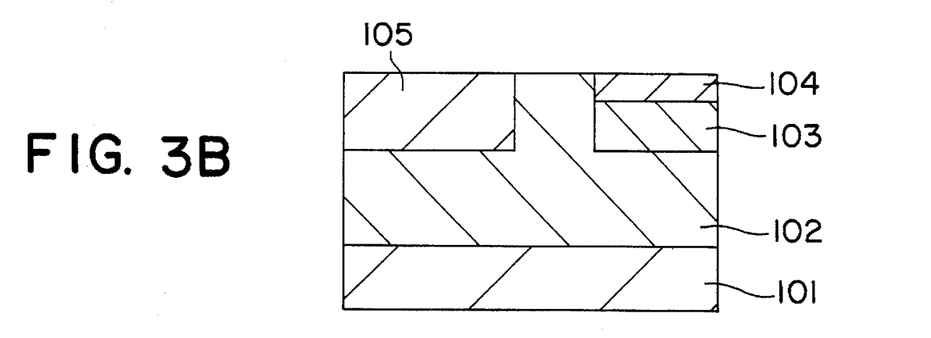

Referring to FIG. 3B, a photoresist is applied on the p-type well layer 102 to implant ions of a p-type impurity and an n-type impurity into the p-type well layer 102 respectively, thus forming the p-type well layer 103 and the n-type well layer 104 to be used as a charge transfer region respectively. After that, an n-type impurity is implanted into the p-type well layer 102 by use of the ion implantation method to form the n-type semiconductor layer 105 to be used as a photoelectric conversion region. The formation of the n-type semiconductor layer 105 may be carried out before that of the p-type well layer 103 and the n-type well layer 104.

Figure 3C:
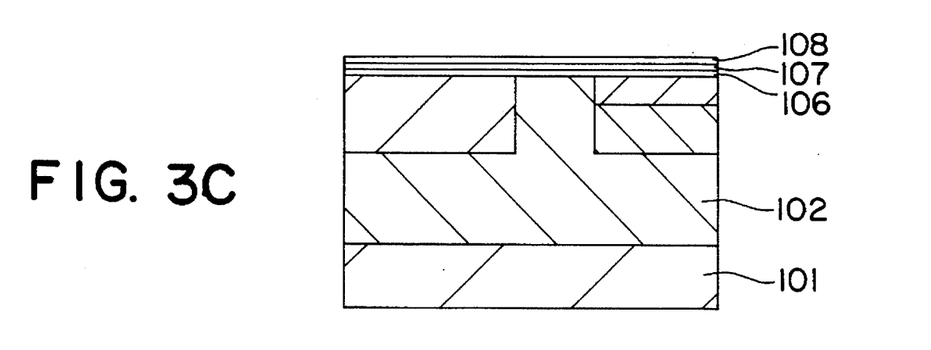

Referring to FIG. 3C, the silicon oxide film 106 having a thickness of 20 to 70 nanometers is formed on a surface of the device by use of a thermal oxidation method, the silicon nitride film 107 having a thickness of 5 to 30 nanometers is deposited on the silicon oxide film 106 by use of a chemical vapor deposition (CVD) method and also the first CVD silicon oxide film 108 having a thickness of 5 to 30 nanometers is deposited on the silicon nitride film 107 by use of the CVD method. Those three films 106, 107 and 108 constitute a first gate ONO (oxide-nitride-oxide) film.

Figure 3D:
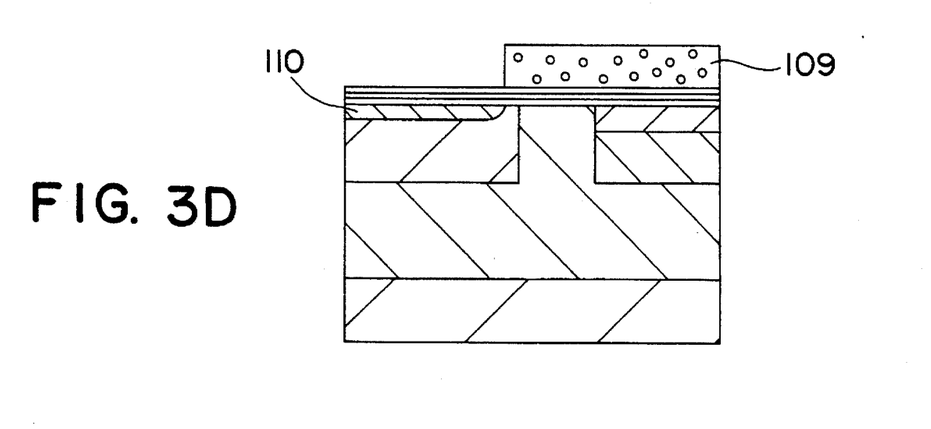

Referring to FIG. 3D, the first polycrystalline silicon film is deposited over the first gate ONO film over the charge transfer region and an upper region of the p-type well layer 102 by use of the CVD method. After that, the first polycrystalline silicon film is subjected to a patterning by use of a dry etching method to defined the first charge transfer electrode 109. Subsequently, the photoresist and the first charge transfer electrode 109 are used as a mask to implant a p-type impurity into the surface of the n-type semiconductor layer 105, thereby forming the shallow p-type semiconductor layer 110. The first charge transfer electrode 109 is used as a mask, thus etching an exposed first CVD silicon oxide film 108 by use of a wet etching method.

Figure 3E:
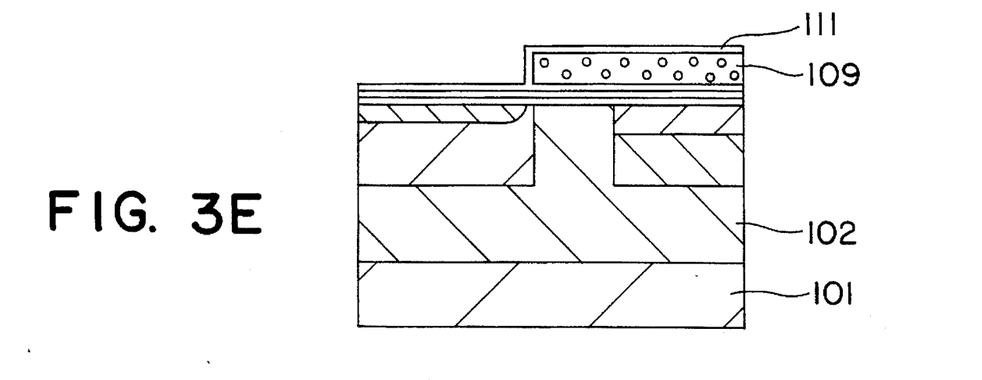

Referring to FIG. 3E, a second CVD silicon oxide film 111 having a thickness of 5 to 30 nanometers is formed on a surface of the device by use of the CVD method. The silicon oxide film 106, the silicon nitride film 107 and the second CVD silicon oxide film 111 constitute a second gate ONO film.

Figure 3F:
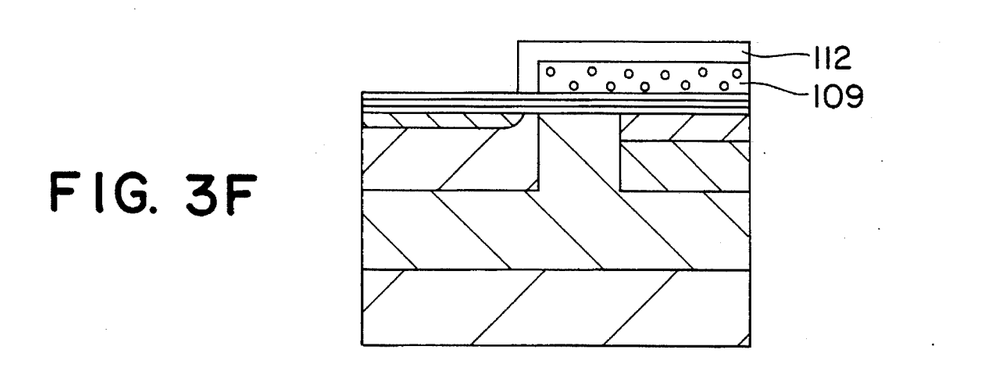

Referring to FIG. 3F, the silicon nitride film 107 is used as a mask, by which the first interlayer insulator 112 having a thickness of 200 to 400 nanometers is formed on the surface of the first charge transfer electrode 109 by use of the thermal oxidation method.

Figure 3G:
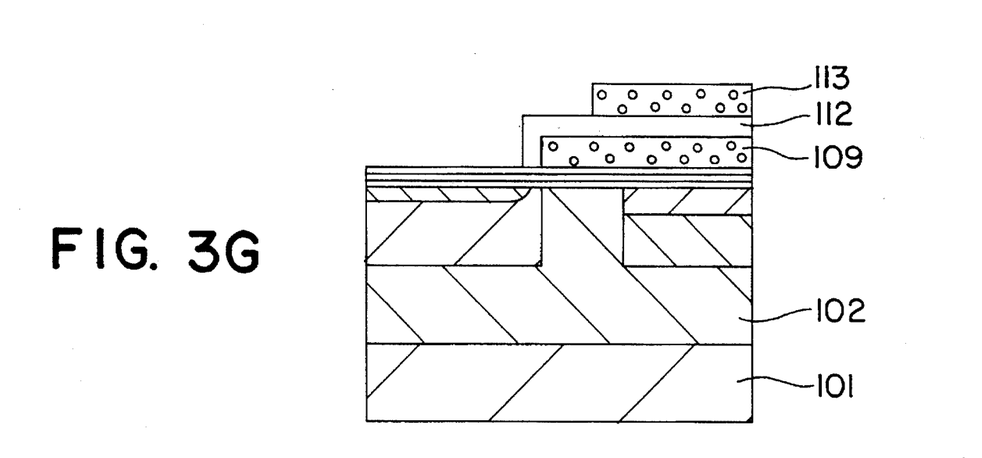

Referring to FIG. 3G, a second polycrystalline silicon film is deposited over the first interlayer insulator 112 over the charge transfer region and an upper region of the p-type well layer 102 spaced apart from the first charge transfer electrode 109 through the first interlayer insulator 112 by use of the CVD method. The second polycrystalline silicon film is subjected to a patterning to define the second charge transfer electrode 113 by use of a photo-lithography method. Subsequently, the second charge transfer electrode 113 is used as the mask, thereby etching an exposed second CVD silicon oxide film 111 by use of the wet etching method.

Figure 3H:
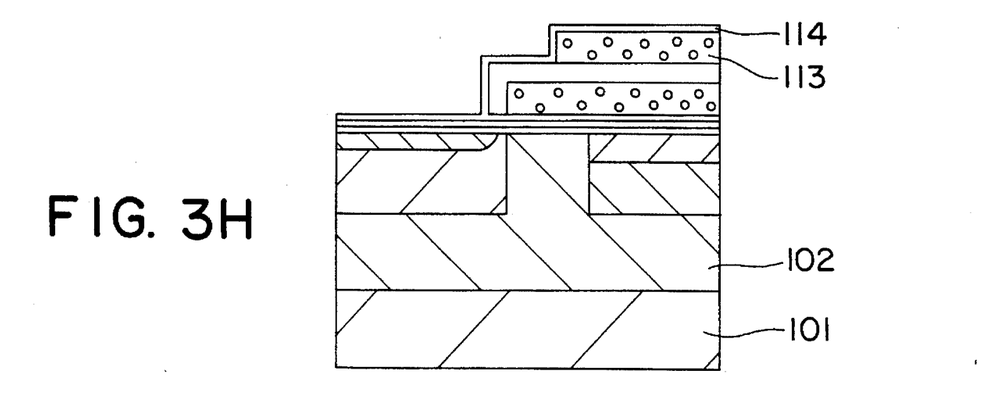

Referring to FIG. 3H, a third CVD silicon oxide film 114 having a thickness of 5 to 30 nanometers is formed on a surface of the device by use of the CVD method.

Figure 3I:
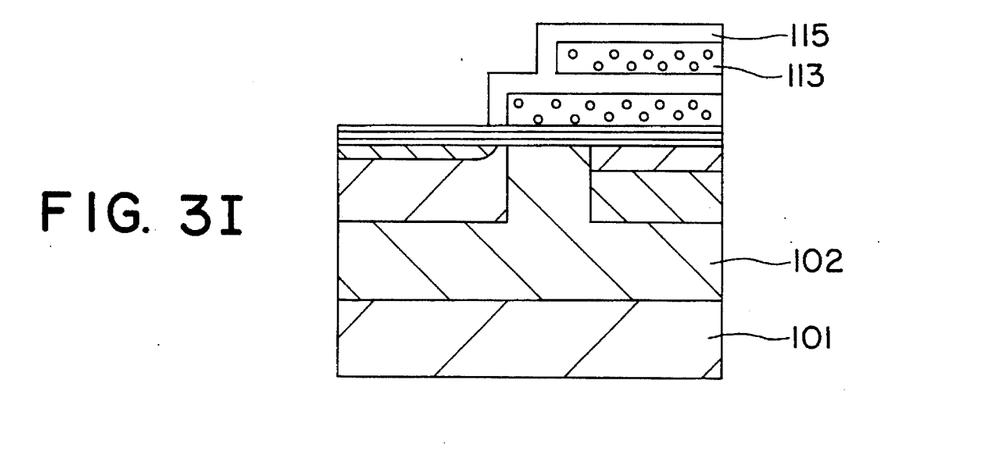

Referring to FIG. 3I, the silicon nitride film 107 is used as the mask to carry out the thermal oxidation, thus forming the second interlayer insulator 115 having a thickness of 200 to 400 nanometers on the surface of the second charge transfer electrode 113.

Figure 3J:
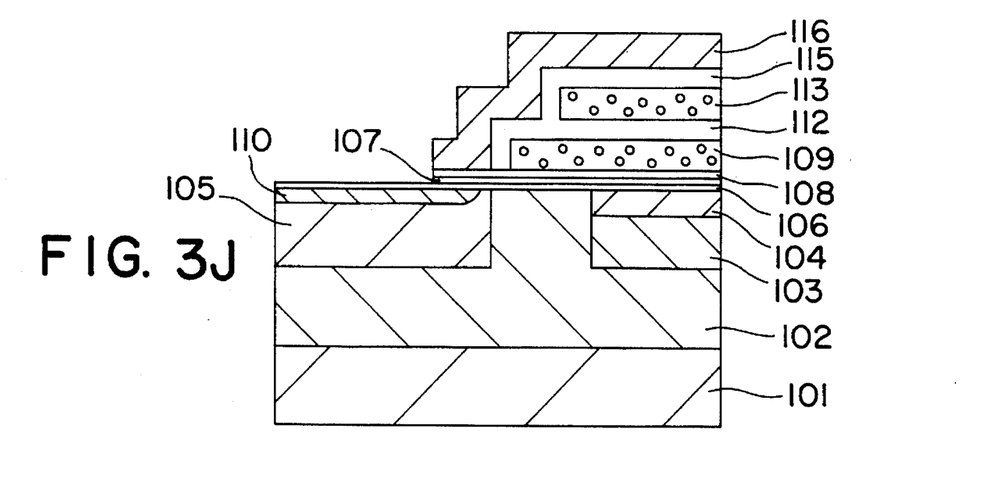

Referring to FIG. 3J, tungsten (W) is deposited over the first and second electrodes 109 and 113 and a part of the photoelectric conversion region by use of a spattering method to be subjected to a patterning to define the shield film 116. In this step, before forming the shield film 116, an exposed third CVD silicon oxide film 114 and silicon nitride film 107 may be etched if necessary.

Figure 4:
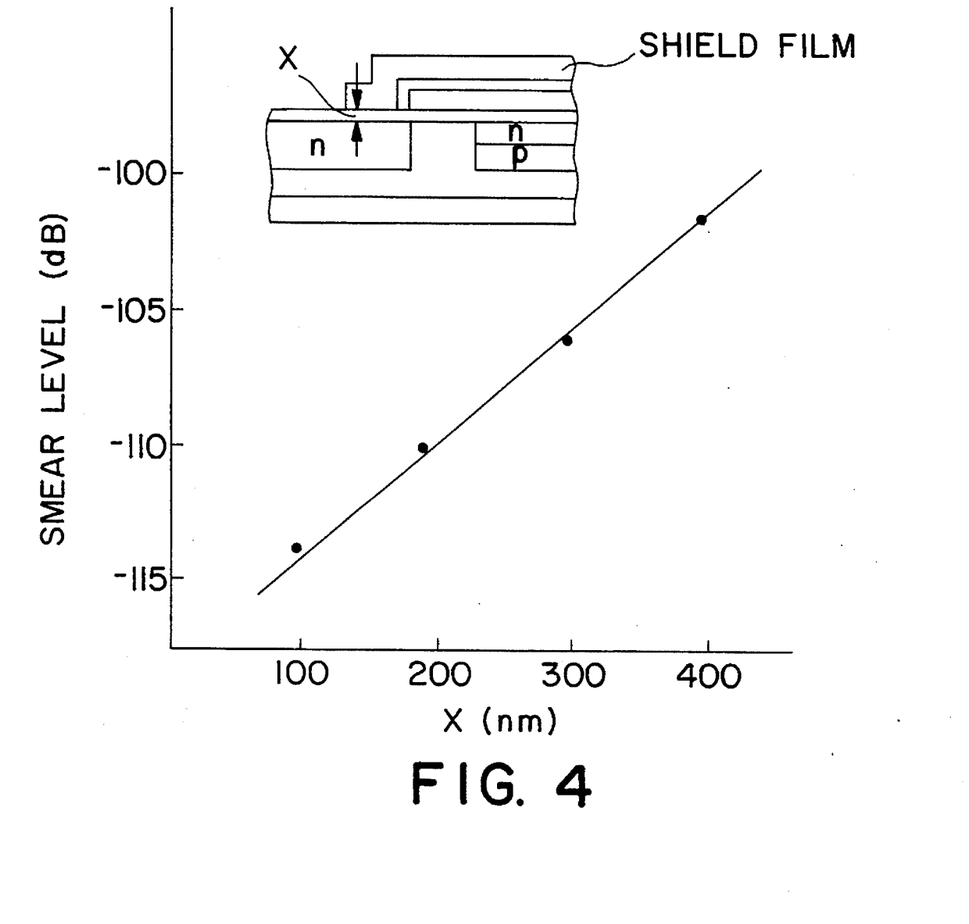
FIG. 4 is a graph showing a thickness of a gate silicon oxide film versus a smear level of a first embodiment according to the invention.

According to the first embodiment, the feature of the solid imaging device is like that there is only the insulation film between the silicon substrate and the shield film, which has a thickness being equal to or less than that of the first gate ONO film between the silicon substrate and the first charge transfer electrode. Therefore, the distance between the silicon substrate and the shield film can be made small to hundred nanometers order as compared with that of the conventional method. The above feature provides to reduce the smear level because the smear level linearly depends on the distance X between the silicon substrate and the shield film as shown in FIG. 4. Thus, to reduce the distance X, it is extremely effective to reduce the smear level and as a result of the first embodiment, the smear level can be improved by 10 to 15 dB.

In the first embodiment, the silicon nitride film 107 may be replaced by other oxide film (an oxidation-resistant film) which has an etching speed extremely slow as compared with the silicon oxide film and performs as the mask against the thermal oxidation. Further, the formation of the third CVD silicon oxide film 114 may be omitted, by which the distance between the silicon substrate and the shield film can make short.

Although the charge transfer electrodes are formed of two polycrystalline silicon films in the first embodiment, one or three polycrystalline silicon films are available. Further, tungsten used for the shield film 116 may be replaced by other metals such as aluminum (Al).

A solid imaging device of a second embodiment according to the invention will be described with reference to the accompanying drawings.

Figure 5A:
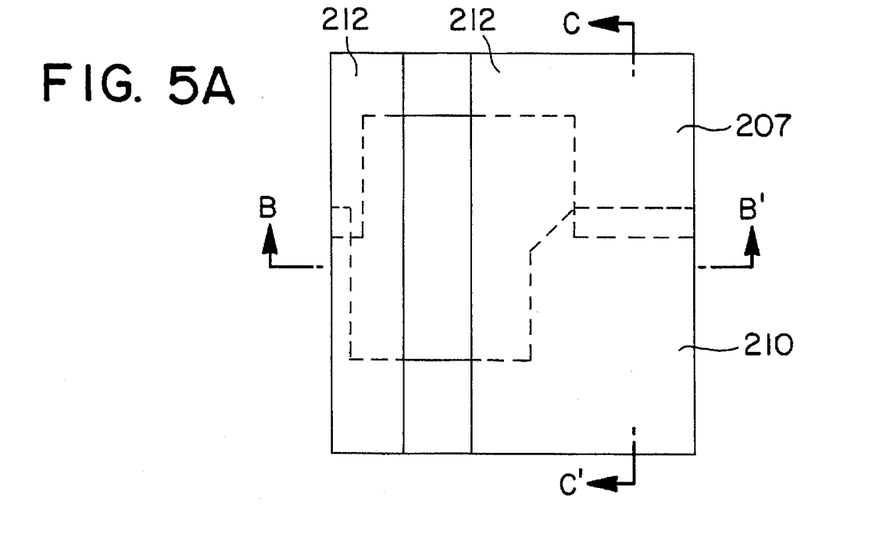
FIG. 5A is a plain view showing a solid imaging device of a second embodiment according to the invention.
Figure 5B:
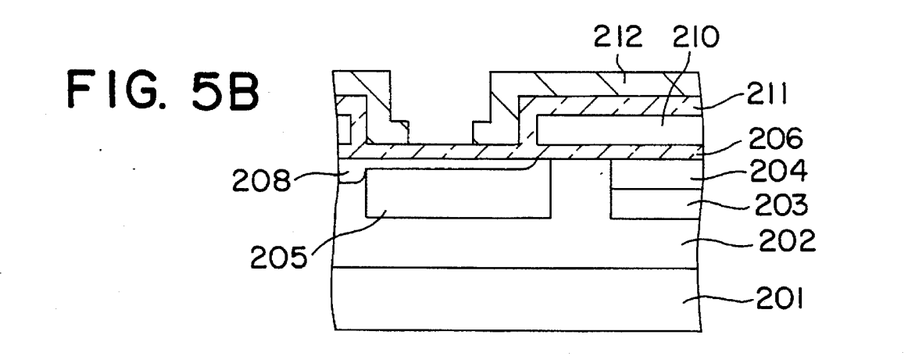
FIG. 5B is a cross sectional view taken generally on line B—B' in FIG. 5A showing a solid imaging device of a second embodiment according to the invention.
Figure 5C:
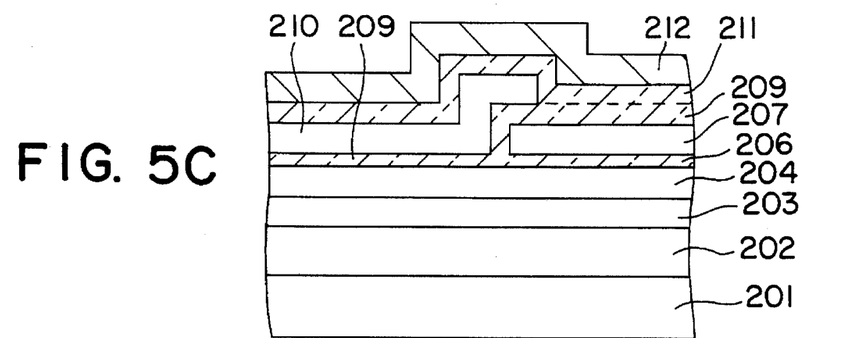
FIG. 5C is a cross sectional view taken generally on line C—C' in FIG. 5A showing a solid imaging device of a second embodiment according to the invention.

In FIGS. 5A through 5C, a pixel of a solid imaging device fabricated by use of a method of the invention comprises an n-type silicon substrate 201, a p-type well layer 202, a p-type well layer 203 used as a charge transfer region (a vertical CCD), an n-type well layer 204 for transferring a signal charge in the charge transfer region, an n-type semiconductor layer 205 use as a photoelectric conversion region, a first gate silicon oxide film 206, a first charge transfer electrode 207 made of a polycrystalline silicon for controlling of transfer of the signal charges in the charge transfer region, a p-type semiconductor layer 208 for separating the n-type semiconductor region 205 from the first gate silicon oxide film 206 to reduce an dark current, a second gate silicon oxide film 209, a second charge transfer electrode 210 made of the polycrystalline silicon for controlling of transfer of the signal charges in the charge transfer region, a interlayer insulator 211 and a shield film 212 made of tungsten for preventing an incident light to enter into all surface of the device except for said photoelectric conversion region.

Figure 6A:
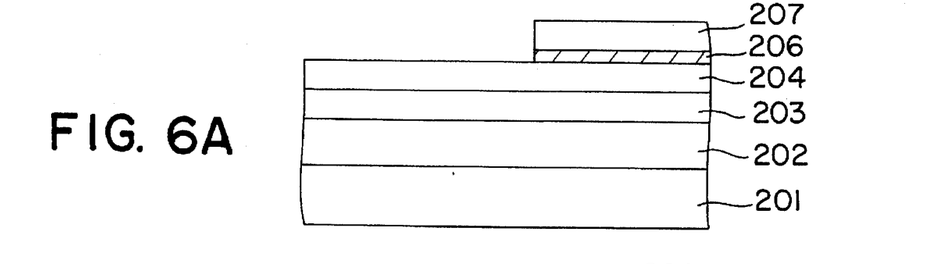
FIGS. 6A through 6D are cross sectional view showing sequential steps of a method for fabricating a solid imaging device of a second embodiment according to the invention.

The above solid imaging device is fabricated by the following manner. Referring to FIG. 6A, the n-type silicon substrate 201 is prepared to form the solid imaging device. A boron (B) is implanted into the surface of the n-type silicon substrate 201 by use of an ion implantation to form the p-type well layer 202 by a heat treatment at approximately 1200° C. Subsequently, a photoresist is applied on the p-type well layer 202 to implant ions of a p-type impurity and an n-type impurity into the p-type well layer 202 to form the p-type well layer 203 and the n-type well layer 204 of a flush channel respectively. After that, an n-type impurity is implanted into the p-type well layer 202 by use of the ion implantation method to form the n-type semiconductor layer 205 to be used as the photoelectric conversion region. On the other hand, the n-type semiconductor layer 205 may be formed before forming the p-type well layer 203 and the n-type well layer 204. Subsequently, a $SiH_4$ gas is reacted with a $H_2O$ gas by use of a chemical vapor deposition (CVD) to form the first gate silicon oxide film 206 having a thickness of 70 nanometers on a surface of the device. The thickness of the first gate silicon oxide film 206 has preferably 10 nanometers or more for prevention a breakdown voltage to be dropped and 100 nanometers or less for prevention a smear level to increase. Next, the first polycrystalline silicon film having a thickness of 100 to 250 nanometers is deposited through the first gate silicon oxide film 206 over the charge transfer region and an upper region of the p-type well layer 202. After that, the first polycrystalline silicon film is subjected to a patterning by use of a selective etching method to define the first charge transfer electrode 207.

Figure 6B:
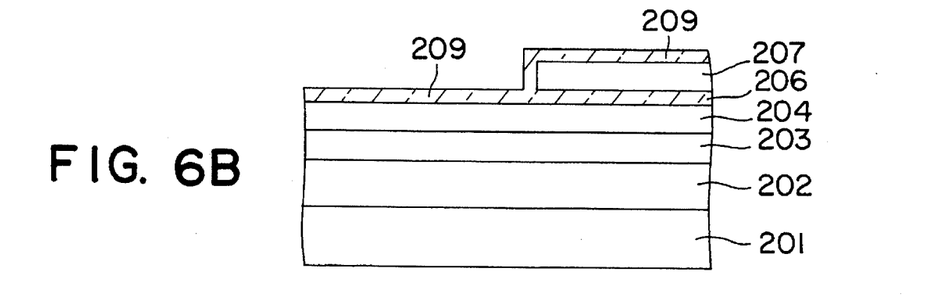

Referring to FIG. 6B, the first charge transfer electrode 207 is used as a mask to etch an exposed first gate silicon oxide film 206 by a wet etching with hydrofluoric acid. Subsequently, a $SiH_4$ gas is reacted with a $H_2O$ gas by use of the CVD method to form the second gate silicon oxide film 209 having a thickness of 70 nanometers on a surface of the device.

Figure 6C:
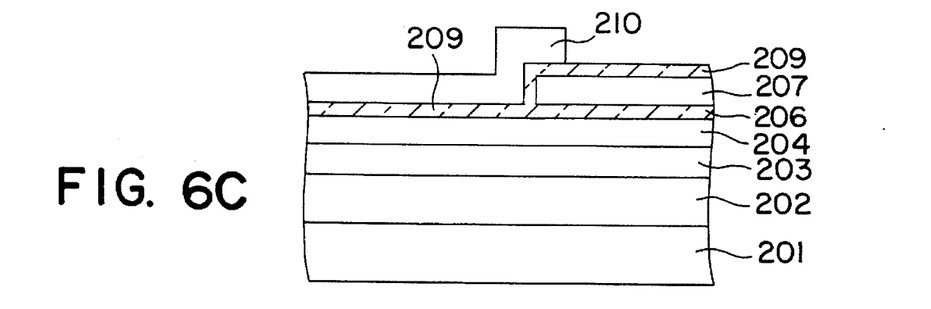

Referring to FIG. 6C, the second polycrystalline silicon film having a thickness of approximately 100 to 250 nanometers is deposited through the second gate silicon oxide film 209 over the charge transfer region and an upper region of the p-type well 202 spaced apart from the first charge transfer electrode 207 by the CVD method. After that the second polycrystalline silicon film is subjected to a patterning to define the second charge transfer electrode 210. The second gate silicon oxide film 209 constitutes a interlayer insulator between the first and second charge transfer electrodes 207 and 210.

Figure 6D:
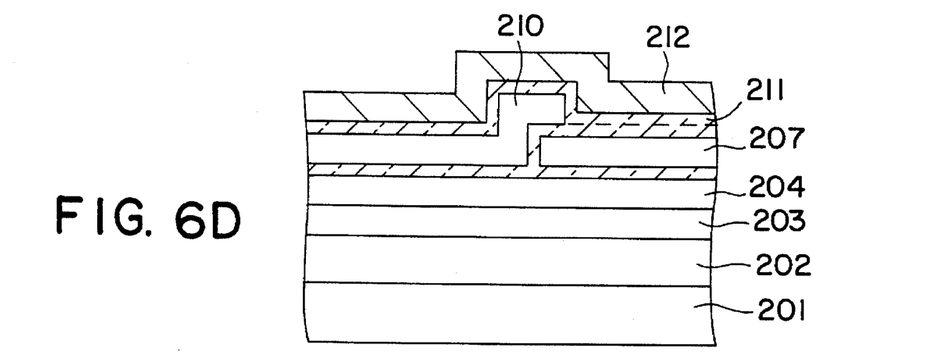

Referring to FIG. 6D, a $SiH_4$ gas is reacted with a $H_2O$ gas to be deposited on a surface of the device by use of the CVD method to form the interlayer insulator 211 having a thickness of approximately 100 nanometers. Subsequently, a tungsten (W) is deposited over the first and second charge transfer electrodes 207 and 210 and a part of the photoelectric conversion region by a sputtering method with WF$_6$ gas to be subjected to a patterning to define the shield film 212 having a thickness of approximately 400 nanometers.

According to the second embodiment, the feature of the solid imaging device is like that the thickness of the second gate silicon oxide film 209 can be reduced. Therefore, the distance between the silicon substrate and the shield film can be made small to hundred nanometers order. The above feature provides to reduce the smear level because the smear level linearly depends on the distance X between the silicon substrate and the shield film as shown in FIG. 4. Thus, to reduce the distance X, it is extremely effective to reduce the smear level and as a result of the second embodiment, the smear level can be improved by 10 to 15 dB.

In the second embodiment, an excellent characteristic is further obtained about the breakdown voltage. The silicon oxide films formed by use of the CVD method have a breakdown voltage of 41 volts in spite of their thickness of approximately 70 nanometers. This results is in the same breakdown voltage when the silicon oxide film having a thickness of approximately 200 nanometers is formed by use of the thermal oxidation method of the prior art. Therefore, an excellent breakdown voltage can be obtained in the second embodiment without use of a thick polycrystalline silicon film.

When the gate silicon oxide film consists of a thermal oxidation film, a silicon nitride film and a CVD silicon oxide film (therefore properly an ONO film), dangling bonds of silicon occur between the silicon substrate and the oxide film, resulting in that a dark current is increased. According to the second embodiment, however, the second gate silicon oxide film is formed by use of the CVD method, so that the stress is reduced due to reduced dangling bonds of the silicon nitride film. Therefore, the dark current is reduced down to 1.1 mV.

Further, in the second embodiment, a tungsten used for the shield film 116 may be replaced by other metals such as aluminum (Al).

A solid imaging device of a third embodiment according to the invention will be described with reference to the accompanying drawings.

Figure 7A:
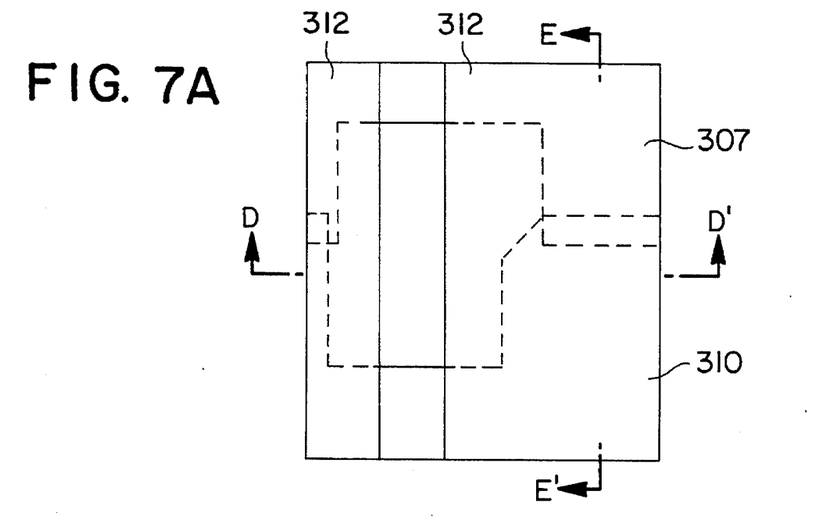
FIG. 7A is a plain view showing a solid imaging device of a third embodiment according to the invention.
Figure 7B:
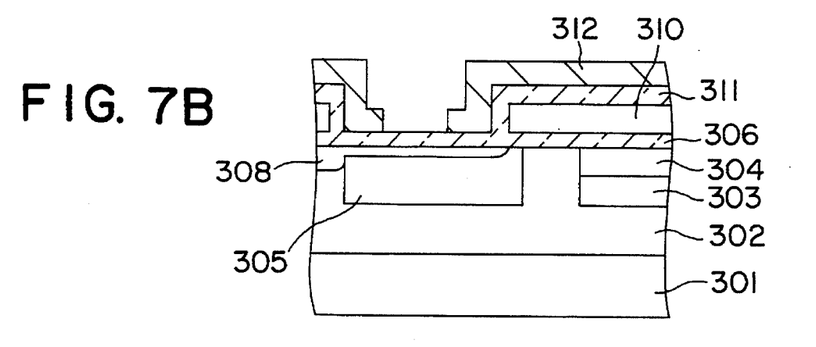
FIG. 7B is a cross sectional view taken generally on line D—D' in FIG. 7A showing a solid imaging device of a third embodiment according to the invention.
Figure 7C:
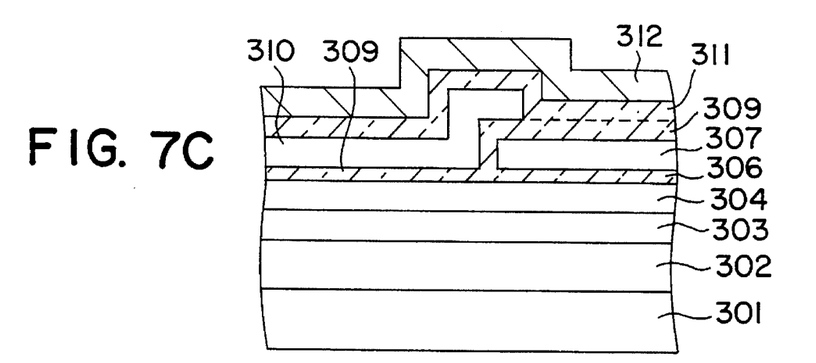
FIG. 7C is a cross sectional view taken generally on line E—E' in FIG. 7A showing a solid imaging device of a third embodiment according to the invention.

In FIGS. 7A through 7C, a pixel of a solid imaging device fabricated by use of a method of the invention comprises an n-type silicon substrate 301, a p-type well layer 302, a p-type well layer 303 used as a charge transfer region (a vertical CCD), an n-type well layer 304 for transferring a signal charge in the charge transfer region, an n-type semiconductor layer 305 used as a photoelectric conversion region, a first gate silicon oxide film 306, a first charge transfer electrode 307 made of a polycrystalline silicon for controlling of transfer of the signal charges in the charge transfer region, a p-type semiconductor region 308 for separating the n-type semiconductor layer 305 from the first gate silicon oxide film 306 to reduce an dark current, a second gate silicon oxide film 309, a second charge transfer electrode 310 made of the polycrystalline silicon for controlling of transfer of the signal charges in the charge transfer region, an interlayer insulator film 311 and a shield film 312 made of tungsten for preventing an incident light to enter into all surface of the device except for the photoelectric conversion region.

Figure 8A:
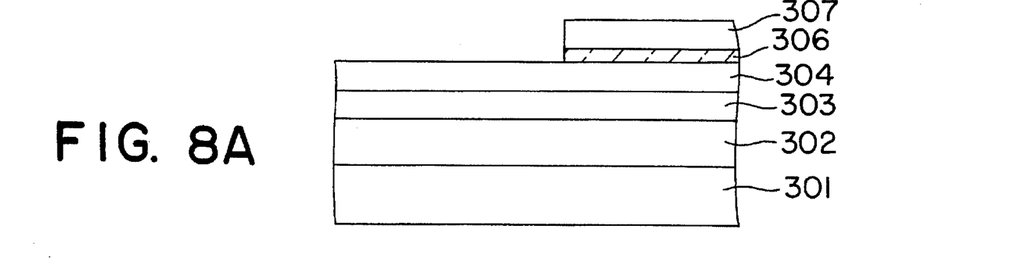
FIGS. 8A through 8D are cross sectional view showing sequential steps of a method for fabricating a solid imaging device of a third embodiment according to the invention.

The above solid imaging device is fabricated by the following manner. Referring to FIG. 8A, the n-type silicon substrate 301 is prepared to form the solid imaging device. A boron (B) is implanted into the surface of the n-type silicon substrate 301 by an ion implantation to form the p-type well layer 302 by a heat treatment at 1200° C. Subsequently, a photoresist is applied on the p-type well layer 302 to implant ions of a p-type impurity and an n-type impurity respectively into the p-type well layer 302 to form the p-type well layer 303 and the n-type well layer 304 of a flush channel in the charge transfer region. After that, an n-type impurity is implanted into the p-type well layer 302 by use of the ion implantation to form the n-type semiconductor layer 305 to be used as the photoelectric conversion region. On the other hand, the n-type semiconductor region 305 may be formed before forming the p-type well layer 303 and the n-type well layer 304. Subsequently, a SiH$_4$ gas is reacted with a H$_2$O gas by use of a chemical vapor deposition (CVD) to form the first gate silicon oxide film 306 having a thickness of 70 nanometers on the device. The thickness of the first gate silicon oxide film 306 has preferably 10 nanometers or more for prevention a breakdown voltage to be dropped and 100 nanometers or less for prevention a smear level to increase. Next, the first polycrystalline silicon film having a thickness of 100 to 250 nanometers is deposited through the first gate silicon oxide film 306 the charge transfer region and an upper region of the p-type well layer 302. After that, the first polycrystalline silicon film is subjected to a patterning by use of a selective etching method to defined the first charge transfer electrode 307. Subsequently, the first charge transfer electrode 307 is used as a mask to etch an exposed first gate silicon oxide film 306 by a wet etching with hydrofluoric acid.

Figure 8B:
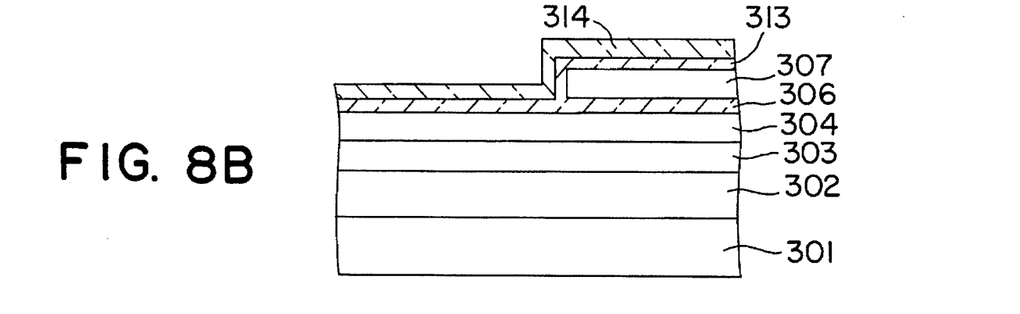

Referring to FIG. 8B, a silicon oxide film 313 having a thickness of approximately 5 to 20 nanometers is formed on a surface of the device by use of a thermal oxidation method, after which a silicon oxide film 314 having a thickness of approximately 60 nanometers is deposited on the silicon oxide film 313 by use of the CVD method at 700° C. or more. The silicon oxide films 313 and 314 constitute the second gate silicon oxide film 309.

Figure 8C:
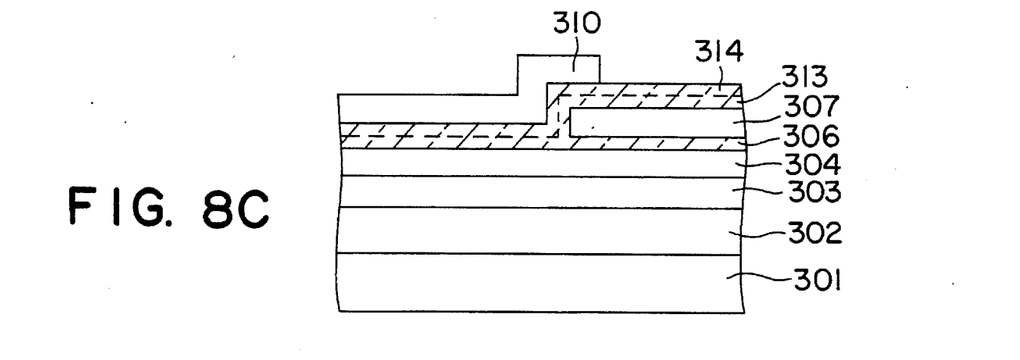

Referring to FIG. 8C, the second polycrystalline silicon film having a thickness of approximately 100 to 250 nanometers is deposited through the second gate silicon oxide film 309 over the charge transfer region and an upper region of the p-type well layer 302 spaced apart from the first charge transfer electrode 307 by the CVD method. After that, the second polycrystalline silicon film is subjected to a patterning to define the second charge transfer electrode 310. The second gate silicon oxide film 309 constitutes an interlayer insulator between the first and second charge transfer electrodes 307 and 310.

Figure 8D:
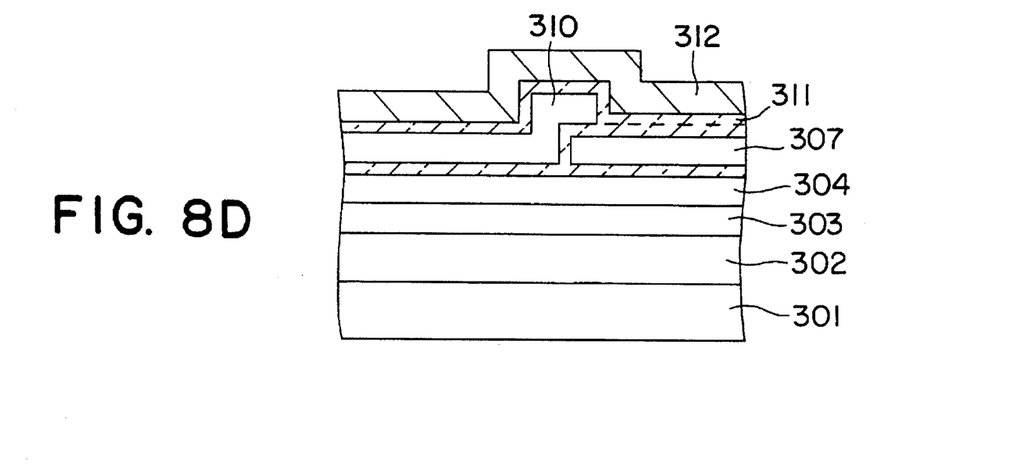

Referring to FIG. 8D, a SiH$_4$ gas is reacted with a H$_2$O gas to be deposited on a surface of the device by use of the CVD method to form the layer insulation film 311 having a thickness of approximately 100 nanometers. Subsequently, a tungsten (W) is deposited over the first and second charge transfer electrodes 307 and 310 and the photoelectric conversion region by a sputtering method with WF$_6$ gas to be subjected to a patterning to define the shield film 312 having a thickness of approximately 400 nanometers.

According to the third embodiment, the feature of the solid imaging device is like that the thickness of the second gate silicon oxide film 309 can be reduced. Therefore, the distance between the silicon substrate and the shield film can be made small to hundred nanometers order. The above feature provides to reduce the smear level because the smear level linearly depends on the distance X between the silicon substrate and the shield film as shown in FIG. 4. Thus, to reduce the distance X, it is extremely effective to reduce the smear level and as a result of the third embodiment, the smear level can be improved by 10 to 15 dB.

In the third embodiment, an excellent characteristic is further obtained about the breakdown voltage. The second silicon oxide film consists of the thermal oxidation film and the CVD silicon oxide film so that the breakdown voltage between the first and the second charge transfer electrodes is improved by approximately 10% as compared with the second embodiment.

When the gate silicon oxide film consists of a thermal oxidation film, a silicon nitride film and a CVD silicon oxide film (therefore properly an ONO film), dangling bonds of silicon occur between the silicon substrate and the silicon oxide film, resulting in that a dark current is increased. According to the second embodiment, however, the second gate silicon oxide film is formed by use of the CVD method, so that the stress is reduced due to reduced dangling bonds of the nitride film. Therefore, the dark current is reduced down to 1.1 mV.

In the third embodiment, a tungsten used for the shield film 116 may be replaced by other metals such as aluminum (Al).

Further, in the second and third embodiments, although the first gate silicon oxide film is formed by use of the CVD method, it may be formed by use of the thermal oxidation method.

Whereas modifications of the present invention will no doubt be apparent to a person of ordinary skilled in the art to which the invention pertains, it is to be understood that the embodiments shown and described by way of illustration are by no means intended to be considered in a limiting sense. Accordingly, it is to be intended by the claims to cover all modifications of the invention which fall within the spirit and scope of the invention.

What is claimed is:

1. A method for fabricating a solid imaging device comprising the steps of:

selectively forming a p-type well layer in an upper region of a substrate;

selectively forming a photoelectric conversion region in a surface of said p-type well layer for permitting a photon to be incident thereupon for subsequent conversion into signal charges;

selectively forming a charge transfer region in said surface of said p-type well layer on an area spaced apart from said photoelectric conversion region for transferring said signal charges;

forming a first silicon oxide film by a thermal oxidation method on said device;

forming a silicon nitride film by a chemical vapor deposition method on said device;

forming a second silicon oxide film by said chemical vapor deposition method on said device;

selectively forming a first electrode through said first silicon oxide film, said silicon nitride film and said second silicon oxide film over said charge transfer region and an upper region of said p-type well layer between said photoelectric conversion region and said charge transfer region for controlling of transfer of said signal charges in said charge transfer region;

etching an exposed part of said second silicon oxide film;

forming a third silicon oxide film by said chemical vapor deposition on said device;

forming a first interlayer insulator by said thermal oxidation method on said first electrode;

selectively forming a second electrode through said first silicon oxide film, said silicon nitride film and said third silicon oxide film over said charge transfer region and an upper region of said p-type well layer between said photoelectric conversion region and said charge transfer region spaced apart from said first electrode through said first interlayer insulator for controlling of transfer of said signal charges in said charge transfer region;

etching an exposed part of said third silicon oxide film;

forming a fourth silicon oxide film by use of said chemical vapor deposition method on said device;

forming a second interlayer insulator on said second electrode; and forming a shield film extending over said first and second electrodes and a part of said photoelectric conversion region for preventing an incident light from entering into all surfaces of the device except for said photoelectric conversion region.

2. A method for fabricating a solid imaging device according to claim 1, wherein the step of forming said shield film comprises the steps of:

forming a shield film on a surface of the device; and selectively removing said shield film to only leave said shield film over said first and second electrodes and a part of said photoelectric conversion region for preventing an incident light from entering into all surfaces of the device except for said photoelectric conversion region.

3. A method for fabricating a solid imaging device according to claim 2, further comprising the step of removing said fourth silicon oxide film and said silicon nitride film which are exposed on the device when said shield film is selectively removed.

4. A method for fabricating a solid imaging device comprising the steps of:

selectively forming a p-type well layer in an upper region of a substrate;

selectively forming a photoelectric conversion region in a surface of said p-type well layer for permitting photons to be incident thereupon for subsequent conversion into signal charges;

selectively forming a charge transfer region in said surface of said substrate on an area spaced apart from said photoelectric conversion region for transferring said signal charges;

forming a first gate silicon oxide film on said device;

selectively forming a first electrode through said first gate silicon oxide film over said charge transfer region and an upper region of said p-type well layer between said photoelectric conversion region of said charge transfer region for controlling of transfer of said signal charges in said charge transfer region;

etching an exposed part of said first gate oxide film;

forming a second gate silicon oxide film on said device;

forming a third gate silicon oxide film on said device;

selectively forming a second electrode through said second and third gate silicon oxide films over said charge transfer region and said upper region of said p-type well layer between said photoelectric conversion region and said charge transfer region spaced apart from said first electrode through said second and third gate silicon oxide films for controlling of transfer of said signal charges in said charge transfer region;

forming an interlayer insulator film on said device; and forming a shield film extending over said first and second electrodes and a part of said photoelectric conversion region for preventing an incident light to enter into all surfaces of the device except for said photoelectric conversion region.

5. A method for fabricating a solid imaging device according to claim 4, wherein said second gate silicon oxide film is formed by a thermal oxidation method.

6. A method for fabricating a solid imaging device according to claim 4, wherein said third gate silicon oxide film is formed by a chemical vapor deposition method.

* * * * *